United States Patent
Zhang et al.

(10) Patent No.: US 9,418,950 B2
(45) Date of Patent: Aug. 16, 2016

(54) MULTIPLE BAND MULTIPLE MODE TRANSCEIVER FRONT END FLIP-CHIP ARCHITECTURE AND CIRCUITRY WITH INTEGRATED POWER AMPLIFIERS

(71) Applicant: RFAXIS, INC, Irvine, CA (US)

(72) Inventors: Lisette L. Zhang, Irvine, CA (US); Oleksandr Gorbachov, Irvine, CA (US)

(73) Assignee: SKYWORKS SOLUTIONS, INC., Woburn, ME (US)

( * ) Notice: Subject to any disclaimer, the term of this patent is extended or adjusted under 35 U.S.C. 154(b) by 10 days.

(21) Appl. No.: 14/260,130

(22) Filed: Apr. 23, 2014

(65) Prior Publication Data

US 2014/0323066 A1  Oct. 30, 2014

Related U.S. Application Data

(60) Provisional application No. 61/815,670, filed on Apr. 24, 2013.

(51) Int. Cl.
*H04B 1/40* (2015.01)
*H01L 23/00* (2006.01)
(Continued)

(52) U.S. Cl.
CPC ............ *H01L 24/05* (2013.01); *H01L 23/5227* (2013.01); *H01L 23/66* (2013.01); *H01L 24/02* (2013.01); *H03F 3/195* (2013.01); *H01L 24/06* (2013.01); *H01L 24/13* (2013.01); *H01L 2223/6644* (2013.01); *H01L 2223/6661* (2013.01); *H01L 2223/6688* (2013.01);
(Continued)

(58) Field of Classification Search
CPC .............. H01L 2924/00; H01L 2924/00014; H01L 2224/48091; H01L 2924/1306; H01L 2224/16225; H01L 2224/48227; H01L 2224/32225; H01L 2924/3011; H01L 2924/13091; H01L 2924/12041; H01L 2224/73265; H01L 2924/30107; H01L 2924/1531; H03F 3/195; H03F 3/245; H03F 1/0227; H03F 1/0277; H03F 2200/222; H03F 2200/336; H03F 2200/387; H03F 3/211; H03F 2200/414; H03F 2200/417; H03F 2200/451; H03F 2203/21106; H03F 1/0261; H03F 2200/171; H03F 2200/27
See application file for complete search history.

(56) References Cited

U.S. PATENT DOCUMENTS 6,188,877 B1  2/2001  Boesch et al.
7,123,095 B2  10/2006  Tsutsui et al.
(Continued)

OTHER PUBLICATIONS

International Search Report and Written Opinion for corresponding Patent Cooperation Treaty Application. PCT/US14/35268; Sep. 9, 2014; 4 Pages.

*Primary Examiner* — Golam Sorowar
(74) *Attorney, Agent, or Firm* — Stetina Brunda Garred & Brucker

(57) ABSTRACT

An integrated circuit architecture and circuitry is defined by a die structure with a plurality of exposed conductive pads arranged in a grid of rows and columns. The die structure has a first operating frequency region with a first transmit and receive chain, and a second operating frequency region with a second transmit chain and a second receive chain. There is a shared region of the die structure defined by an overlapping segment of the first operating frequency region and the second operating frequency region with a shared power supply input conductive pad connected to the first transmit chain, the second transmit chain, the first receive chain, and the second receive chain, and a shared power detection output conductive pad connected to the first transmit chain and the second transmit chain.

26 Claims, 8 Drawing Sheets

(51) Int. Cl.
*H01L 23/522* (2006.01)
*H01L 23/66* (2006.01)
*H03F 3/195* (2006.01)
*H04B 1/00* (2006.01)

(52) U.S. Cl.
CPC . *H01L2224/0235* (2013.01); *H01L 2224/0401* (2013.01); *H01L 2224/05552* (2013.01); *H01L 2224/06131* (2013.01); *H01L 2224/06133* (2013.01); *H01L 2224/131* (2013.01); *H01L 2224/13147* (2013.01); *H03F 2200/294* (2013.01); *H04B 1/0067* (2013.01)

(56) References Cited

U.S. PATENT DOCUMENTS

| | | |
|---|---|---|
| 8,289,084 B2 | 10/2012 | Morimoto et al. |
| 2003/0132518 A1 | 7/2003 | Castro |
| 2007/0115054 A1* | 5/2007 | Ichitsubo .............. H03F 1/0261 330/126 |
| 2010/0210299 A1 | 8/2010 | Gorbachov |
| 2014/0087673 A1* | 3/2014 | Mostov ................. H03F 1/0227 455/78 |

* cited by examiner

MULTIPLE BAND MULTIPLE MODE TRANSCEIVER FRONT END FLIP-CHIP ARCHITECTURE AND CIRCUITRY WITH INTEGRATED POWER AMPLIFIERS

CROSS-REFERENCE TO RELATED APPLICATIONS

This application relates to and claims the benefit of U.S. Provisional Application No. 61/815,670 filed Apr. 24, 2013 and entitled "DUAL/MULTI-BAND TRANSCEIVER FRONT END FLIP-CHIP PHYSICAL ARCHITECTURE WITH INTEGRATED POWER AMPLIFIERS" the disclosure of which is wholly incorporated by reference in its entirety herein.

STATEMENT RE: FEDERALLY SPONSORED RESEARCH/DEVELOPMENT

Not Applicable

BACKGROUND

1. Technical Field

The present disclosure relates generally to radio frequency (RF) signal circuitry, and more particularly to multiple band multiple mode transceiver front end flip-chip architectures with integrated power amplifiers.

2. Related Art

Wireless communications systems find applications in numerous contexts involving information transfer over long and short distances alike, and there exists a wide range of modalities suited to meet the particular needs of each. Chief amongst these systems with respect to popularity and deployment is the mobile or cellular phone, and it has been estimated that there are over 4.6 billion subscriptions worldwide.

Generally, wireless communications involve a radio frequency (RF) carrier signal that is variously modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System). Various generations of these technologies exist and are deployed in phases, with one common third generation (3G) UMTS-related modality referred to as UMTS-FDD (frequency division duplexing) being W-CDMA (Wideband Code Division Multiplexing). More recently, 4G (fourth generation) technologies such as LTE (Long Term Evolution), which is based on the earlier GSM and UMTS standards, are being deployed. Besides mobile communications modalities such as these, mobile phones also incorporate local area data networking modalities such as Wireless LAN (WLAN), WiFi, ZigBee, and so forth. Along these lines, last-mile wireless broadband access technologies such as WiMAX (Worldwide Interoperability for Microwave Access) are also being implemented. In earlier iterations, these communications modalities have transmitted and received signals on a single channel or frequency, though the standards and implementing devices are evolving to handle dual band multi-mode and multi-band multi-mode operations.

A fundamental component of mobile handsets, or any wireless communications system for that matter, is the transceiver, that is, the combined transmitter and receiver circuitry. The transceiver encodes the data to a baseband signal and modules it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals.

Conventional mobile handset transceivers typically do not generate sufficient power or have sufficient sensitivity for reliable communications standing alone. Thus, additional conditioning of the RF signal is necessary. The circuitry between the transceiver and the antenna that provide this functionality is referred to as the front end circuit, which includes a power amplifier for increased transmission power, and/or a low noise amplifier for increased reception sensitivity, and antenna switch to switch among different modes such as transmit, receive, Bluetooth modes. Each band or operating frequency of the communications system has a dedicated power amplifier and low noise amplifier.

In order to alternatingly connect the single antenna to one transmit chain and to one receive chain, the front end circuit includes a transmit/receive switch, as well as a power detector to detect the transmitted power, which feeds back to transceiver chain to control gain blocks such as AGC or PGA. Thus, a conventional power amplifier has a transmit input port, an antenna/output port, a voltage supply port, a power detector output port, and various control ports and ground ports. Because mobile devices are powered by an on-board battery, front end circuits therefor also include a low dropout voltage regulator or a buck boost voltage regulator.

The complexity of the front end circuit is further increased for front end circuits of dual band and multi-band communications because of the aforementioned constituent components, and the corresponding input and output lines thereof that are multiplied for each band/operating frequency. This requires additional semiconductor die real estate, which results in increased production costs. Recently, the packaging of front end circuits and other semiconductor integrated devices are increasingly shifting away from quad flat no lead (QFN) to advanced flip chip technologies such as flip chip ball grid arrays (FCBGA), wafer level ball grid arrays (WL-BGA) and wafer level chip scale packaging (WLCSP) to achieve the smallest possible footprint. The reduced sizes and available space attendant to such packaging modalities can present significant challenges, particularly in the design and implementation of RF front end circuit with multiple operating bands and multiple modes. In order to achieve the optimal performance in RF circuit, physical architecture is a critical consideration, as ground current and RF signal path flow affect the isolation, stability, and other performance parameters such as linearity, noise figure, and rejection levels of harmonics and other unwanted signal components. Accordingly, there is a need in the art for improved multiple band transceiver front end flip-chip architectures with integrated power amplifiers.

BRIEF SUMMARY

The present disclosure is directed to an RF integrated circuit architecture in which multiple single band integrated power amplifiers are optimally combined in a single chip dual-band or multi-band transceiver front end flip chip device. Additionally contemplated is configuring dual-band dual-mode or multi-band multi-mode transceiver front end circuits for any individual band based upon a single building block design without modifications to the circuit or wafer-level reconstruction of the same i.e., silicon re-spin. Furthermore, die size can be minimized by maximizing the number of input/output lines and combining individual operating frequency/band components into dual-band or multi-band front end circuits.

According to one embodiment of the present disclosure, an integrated circuit architecture defined by a die structure is envisioned and implemented. The die structure may have a plurality of exposed conductive pads that are arranged in a grid of rows and columns. Furthermore, the die structure may include a first operating frequency region, which may further include a first transmit chain with at least one first operating frequency power amplifier, as well as a first receive chain with at least one first operating frequency low noise amplifier. The die structure may also include a second operating frequency region that has a second transmit chain with at least one second operating frequency power amplifier, as well as a second receive chain with at least one second operating frequency low noise amplifier. The die structure may include a shared region that is defined by an overlapping segment of the first operating frequency region and the second operating frequency region. The shared region may include a shared power supply input conductive pad connected to the first transmit chain, the second transmit chain, the first receive chain, and the second receive chain, and/or a shared power detection output conductive pad connected to the first transmit chain and the second transmit chain. The present disclosure will be best understood accompanying by reference to the following detailed description when read in conjunction with the drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The present disclosure encompasses various embodiments of an integrated circuit architecture with minimal die size while maximizing the performance of active and passive circuit components. The detailed description set forth below in connection with the appended drawings is intended as a description of the several presently contemplated embodiments of the architecture, and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
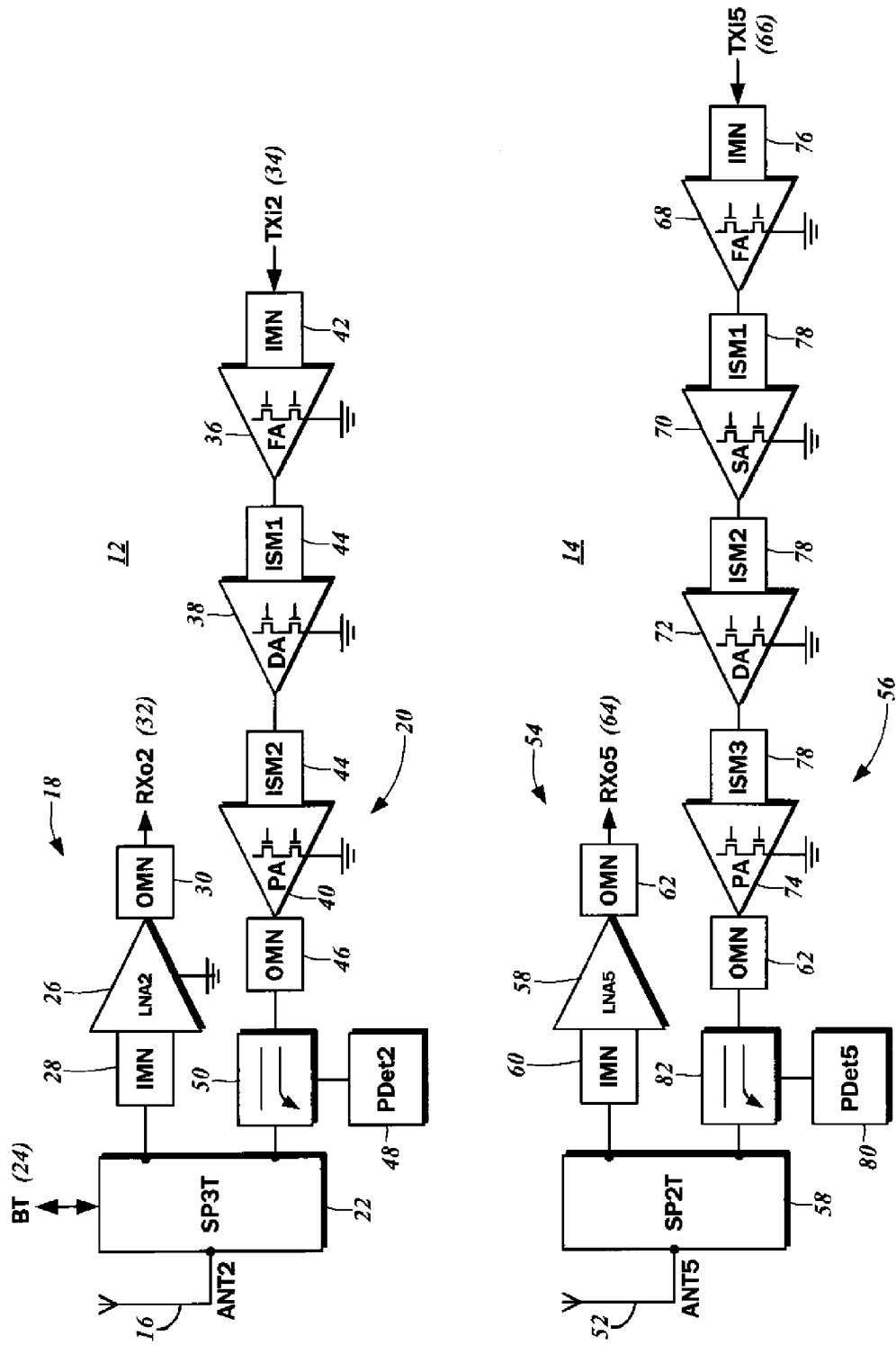
FIG. 1 is a circuit block diagram showing an exemplary dual-band wireless local area networking (WLAN) front end circuit.

With reference to the schematic diagram of FIG. 1, an exemplary multi-mode radio frequency (RF) front end circuit 10 is generally defined by a first operating frequency circuit 12 and a second operating frequency circuit 14. The various embodiments of the present disclosure will be described in the context of a dual band/dual mode IEEE 802.11a/b/g/n/ac wireless data networking system, which utilizes the 2.4 GHz and 5 GHz ISM (Industrial Scientific Medical) frequency bands. In this regard, the first operating frequency circuit 12 is optimized for and particular to the 2.4 GHz band, while the second operating frequency circuit 14 is optimized for and particular to the 5 GHz band. Those having ordinary skill in the art will recognize that the presently disclosed embodiments may be adapted for operation with other RF communications systems such as WCDMA, LTE, GSM, and so forth that may utilize different operating frequencies.

The first operating frequency circuit 12 is connected to an antenna 16, also referred to as ANT2 to denote the 2.4 GHz operating frequency to which it is optimized. There antenna 16 is selectively connected to a receive chain 18 and a transmit chain 20 at a given time, and depends on the function being activated. The connection is made by a switch 22, which in accordance with one embodiment of the present disclosure is a single pole, triple throw type. In addition to connecting the antenna 16 to the receive chain 18 and the transmit chain 20, the switch 22 may also make a connection to a Bluetooth module 24 that likewise utilizes the 2.4 GHz operating frequency.

When a signal is being received, the receive chain 18 is activated. In further detail, the receive chain 18 includes a low noise amplifier 26, likewise denoted as LNA2 to correspond to the example 2.4 GHz operating frequency for which it is tuned. Additionally, the low noise amplifier 26 is connected to an input matching network 28 that impedance matches the low noise amplifier 26 to the antenna 16, as well as an output matching network 30, which impedance matches the low noise amplifier 26 to the input of a transceiver circuit. Relative to the front end circuit 10, an output port 32 of the receive chain 18 is denoted as RXo2, that is, the receive output for the 2.4 GHz operating frequency.

A transmission signal generated by the transceiver circuit and fed to the transmit chain 20, is received at a transmit input port 34 thereof, which is denoted as TXi2, that is, the transmit output for the 2.4 GHz operating frequency. The transmit chain 20 is comprised of multiple amplification stages, including a first amplifier 36, a driver amplifier 38, and a power amplifier 40, all of which may also be collectively referred to as a power amplifier. The presently contemplated integrated circuit architecture may utilize any number of stages according to the specific output power needs of the application. The first amplifier 36 includes an input matching network 42 that impedance matches the first amplifier 36 to the output of the transceiver circuit. The inputs to the driver amplifier 38 and the power amplifier 40 include respective intermediate stage matching circuits 44, and the output of the power amplifier 40 has an output matching network 46 that impedance matches to the antenna 16.

The output power of RF emissions is closely regulated during operation so that permitted maximums are not exceeded. Thus, various implementations of the front end circuit 10 include a power detector 48 for this purpose. The output from the power amplifier 40 is passed to the power detector 48 via a directional coupler 50, as well as to the switch 22 that passes the signal to the antenna 16.

The aforementioned second operating frequency circuit 14 largely operates independently of the first operating frequency circuit. There is a separate antenna 52 referenced as ANT5 to denote the 5 GHz operating frequency to which it is optimized. There antenna 16 is selectively connected to a receive chain 54 and a transmit chain 56 at a given time by a switch 57, which in accordance with one embodiment of the present disclosure is a single pole, double throw type. In contrast to the first operating frequency circuit 12, there is no additional connection to another transmit/receive modality that utilizes the 5 GHz operating frequency.

When the 5 GHz signal is being received, the receive chain 54, which includes a low noise amplifier 58 denoted as LNA5 to correspond to the operating frequency. The low noise amplifier 58 is connected to an input matching network 60 that impedance matches the low noise amplifier 58 to the antenna 52, as well as an output matching network 62, which impedance matches the low noise amplifier 58 to the input of the transceiver circuit. An output port 64 of the receive chain 54 is denoted as RXo5, that is, the receive output for the 5 GHz operating frequency.

A transmission signal generated by the transceiver circuit and fed to the transmit chain 56 is received at a transmit input port 66 thereof, which is denoted as TXi5, that is, the transmit output for the 5 GHz operating frequency. The transmit chain 56 is comprised of multiple amplification stages, including a first amplifier 68, second amplifier 70, a driver amplifier 72, and a power amplifier 74, all of which may also be collectively referred to as a power amplifier. The first amplifier 68 includes an input matching network 76 that impedance matches the first amplifier 68 to the output of the transceiver circuit. The inputs to the second amplifier 70, the driver amplifier 72 and the power amplifier 74 include respective intermediate stage matching circuits 78. The output of the final stage, the power amplifier 74, has an output matching network 78 that impedance matches to the antenna 52. The transmit chain 56 also includes a separate power detector 80 for the 5 GHz operating frequency, which is connected to the output of the power amplifier 74 with a directional coupler 82. The port of the directional coupler 82 not connected to the power detector 80 is connected to a terminal of the switch 57.

Although the first receive chain 18 and the second receive chain 54 are shown with a single stage amplifier, the first transmit chain is shown with four amplifier stages, and the second transmit chain is shown with five amplifier stages, these are by way of example only and not of limitation. Any number of amplification stages may be utilized for the various transmit and receive chains of either of the operating frequencies in the implementations of the presently contemplated integrated circuit architecture.

Figure 2:
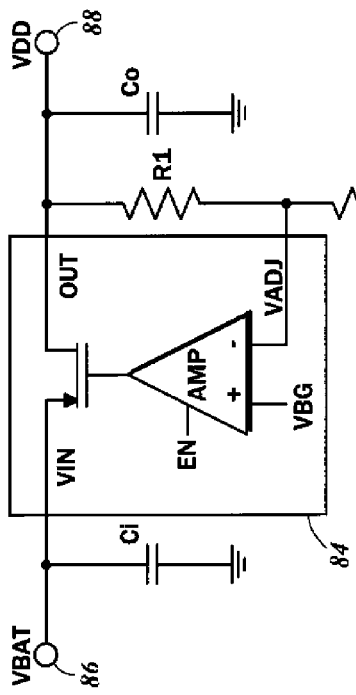
FIG. 2 is a schematic diagram of an example voltage regulator circuit.

Referring the schematic diagram of FIG. 2, power to the various active devices shown in FIG. 1 may be supplied by a low drop-off voltage regulator 84 that is connected to a battery via a battery power input port 86. Other types of voltage regulators known in the art such as buck boost types may be readily substituted without departing from the present disclosure. As will be recognized by those having ordinary skill in the art, the voltage regulator 84 conditions a possibly irregular voltage from the battery to a preset level based on the values of an external resistor network R1 and R2, and maintained at that level as it is output to a voltage supply output port 88 regardless of the input power level. Sudden spikes in input voltage may be eliminated or reduced by an input capacitor Ci, while spikes in the output voltage may be eliminated or reduced by an output capacitor Co.

Figure 3:
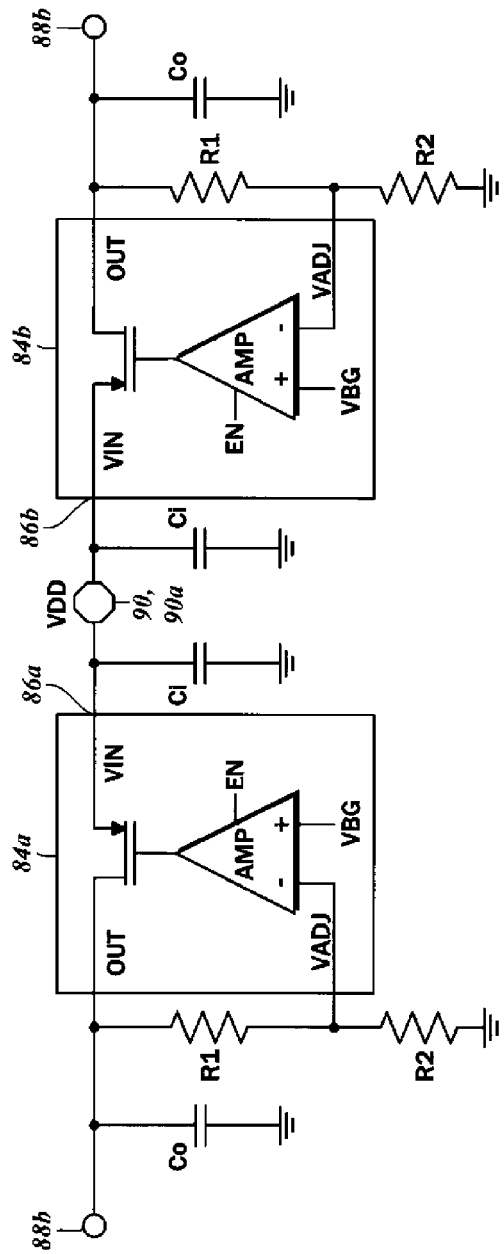
FIG. 3 is a schematic diagram of another example of a voltage regulator circuit including a first low voltage dropout voltage regulator for a first operating frequency and a second low voltage dropout voltage regulator for a second operating frequency.

In accordance with one embodiment of the present disclosure, a separate voltage regulator circuit may be dedicated to the active components of each operating frequency chain. The schematic diagram of FIG. 3 depicts such a configuration, with a first low drop-off voltage regulator 84*a* and a second low drop-off voltage regulator 84*b*. The inputs to the voltage regulators 84 may be common, that is, an exposed conductive pad 90 on the integrated circuit packaging depicted in FIG. 3 as Vdd pad 90*a*, can be shared and electrically connected to a first battery power input port 86*a* of the first low drop-off voltage regulator 84*a*, and a second battery power input port 86*b* of the second low drop-off voltage regulator 84*b*. A single connection to the battery is made via the Vdd pad 90*a*. The respective voltage supply output ports 88*a*, 88*b* are connected to the corresponding operating frequency chain active components. As will be described in further detail below, the voltage regulators 84 are understood to be located in close physical proximity to each other, and to the supply nodes of the various power amplifiers. It is possible for both the first operating frequency chain to share a single voltage regulator 84, with the shared voltage regulator 84 likewise being located in close physical proximity to the supply nodes of the power amplifiers. Regardless of separate or shared voltage regulators 84, various embodiments of the present disclosure contemplate a single external connection to the battery.

Figure 4:
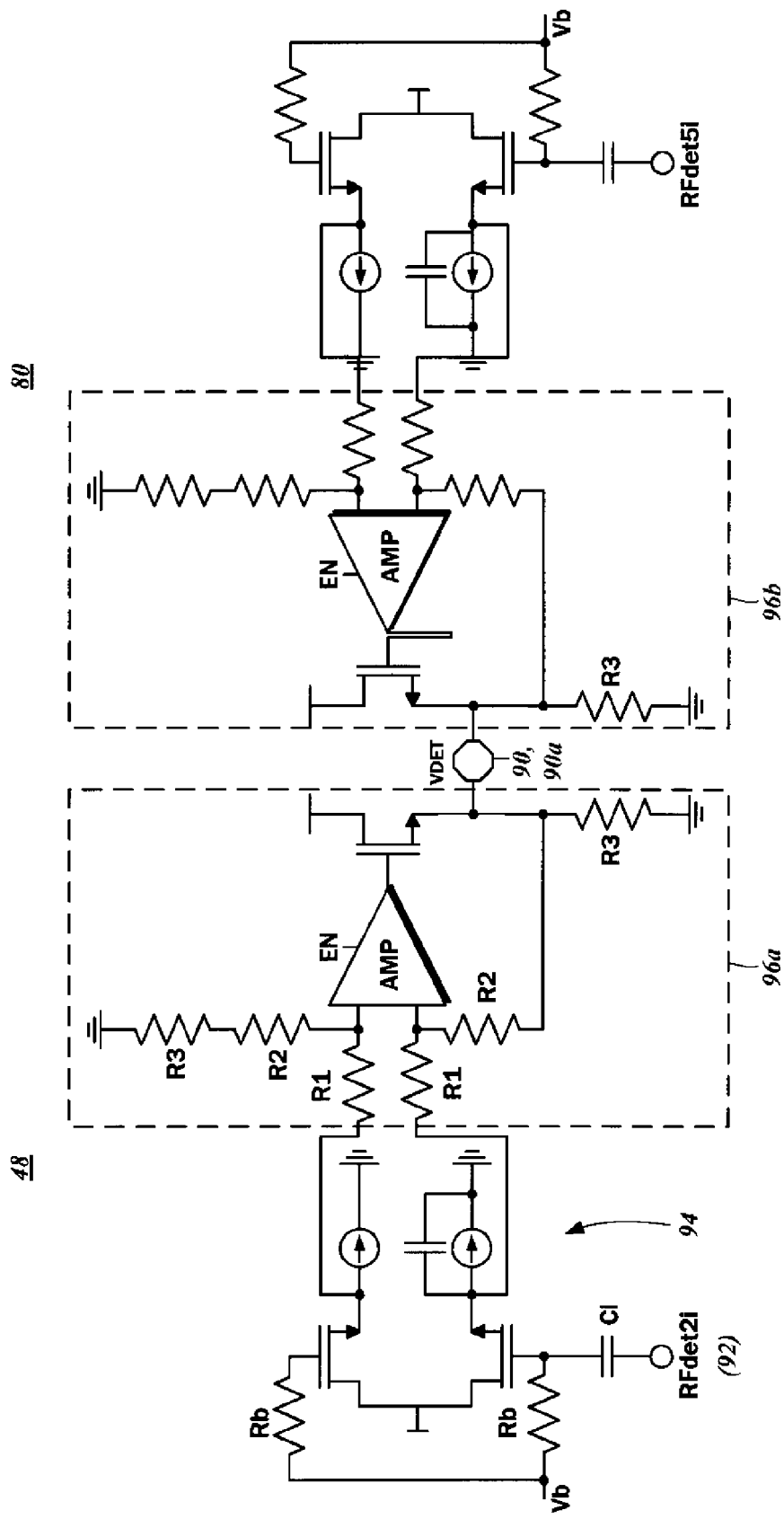
FIG. 4 is a schematic diagram of an example power detector circuit including a first power detector for the first operating frequency and a second power detector for the second operating frequency.

Along these lines, the present disclosure also contemplates the sharing of a single external connection for the power detectors 48, 80. As shown in the schematic diagrams of FIGS. 1 and 4, the power detector 48 has an input 92 that is connected to one of the ports of the directional coupler 50. The power detector 48 is comprised of a detector circuit 94*a* as well as an amplifier circuit 96*a*, the output of which is connected to another exposed conductive pad 90, and in particular Vdet (voltage detector) pad 90*b*. The detector circuit 94*a* and the amplifier circuit 96*a* are understood to be specific to the first operating frequency, e.g., the 2.4 GHz band. Also connected to the Vdet power detector output pad 90*b* is an output of another amplifier circuit 96*b* that is a constituent part of the power detector 80. Additionally, the power detector 80 also includes a detector circuit 94*b*, to which the output from the directional coupler 82 in the second operating frequency transmit chain 56 is connected. Thus, the detector circuit 94*b* and the amplifier circuit 96*b* are specific to the second operating frequency, e.g., the 5 GHz band. In other embodiments, it is possible for the detector circuits 94 to be separate as shown, but share a common amplifier circuit 96. Those having ordinary skill in the art will be able to implement such alternative configurations.

The present disclosure contemplates improvements to the physical implementation of the multi-mode RF front end circuit 10 as a packaged integrated circuit device. According to one embodiment, a flip-chip architecture, in particular, a wafer level chip scale package is utilized, though other related technologies such as flip chip ball grid array (FCBGA), wafer level ball grid array (WLBGA) and the like may be substituted. Generally, such flip chip architectures are defined by a semiconductor die structure (typically of silicon) upon which the various active and passive components are integrated, as well as by the external connections that interface with other parts that are on the die structure. Different semiconductor technologies besides the disclosed silicon substrate may be utilized.

Figure 5:
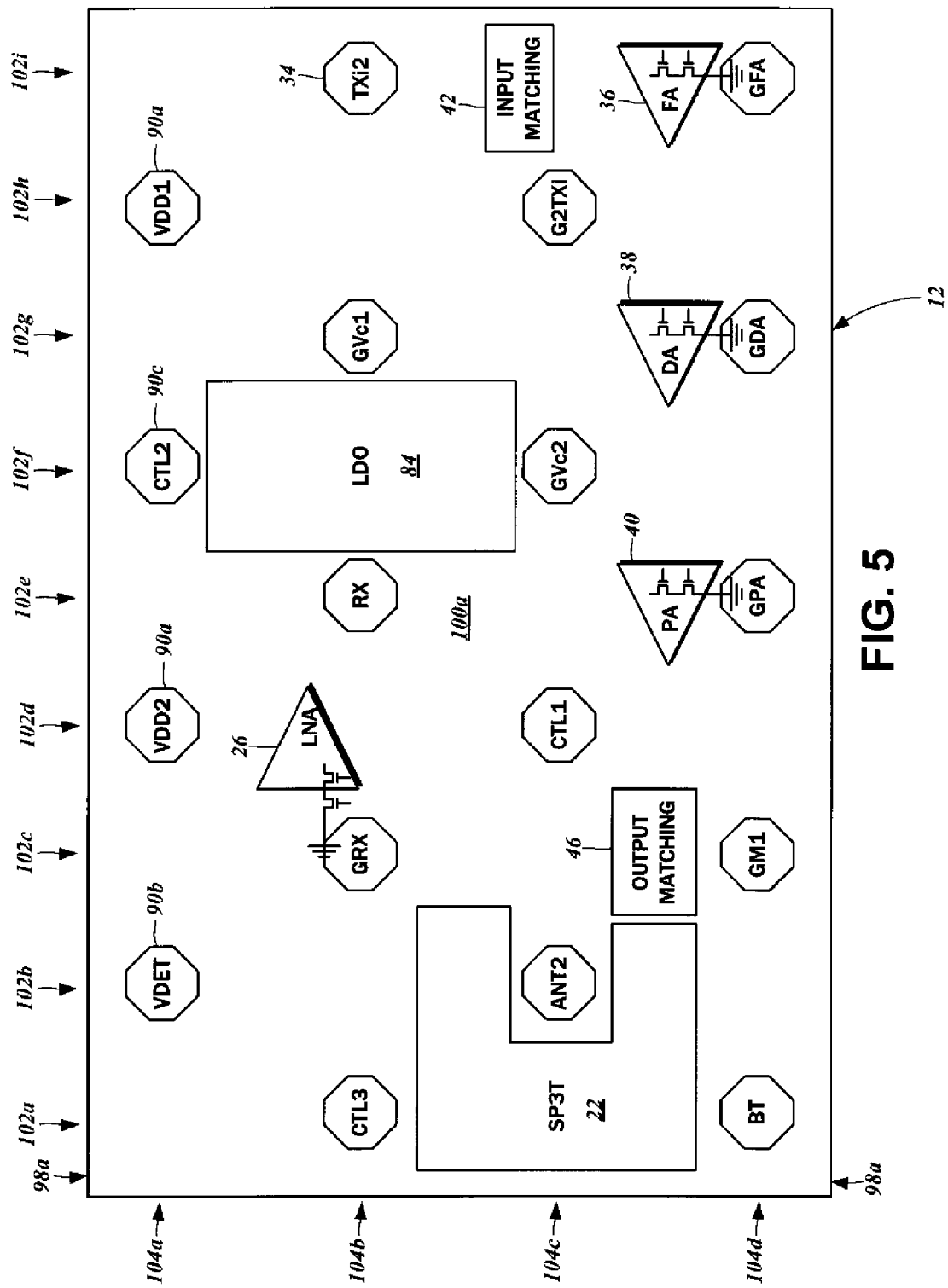
FIG. 5 is a plan view of a die structure pad layout for a first operating frequency circuit.

FIG. 5 depicts a plan view of a layout of these connections, referred to above as the exposed conductive pads 90. This and subsequent plan views of the various embodiments of the semiconductor die structure have symbols of the components of the front end circuit 10 previously discussed in the context of the schematic diagrams of FIGS. 1-4, though this is being presented for ease of reference and to show the relative proximity in the positioning of those components to the exposed conductive pads 90.

The plan view of FIG. 5 is that of a die structure 100a for an exemplary first operating frequency circuit 12. The exposed conductive pads 90 are arranged in a grid of columns 102a-i and rows 104a-d, with alternating rows being vertically offset from the next and alternating columns being horizontally offset from the next. Generally, wafer-level packaging technologies are characterized in that the overall size of the package to be substantially the same as the underlying semiconductor die structure, so the space thereon available for the exposed conductive pads 90 is limited, particularly where there are restrictions with respect to the pitch, or the spacing between each of the pads, as well as to the dimensions of the pads themselves.

The power amplifiers of the transmit chain 20, including the first amplifier 36, the driver amplifier 38, and the power amplifier 40 are positioned along a bottom side 98a of the die structure 100a, with ground connections thereof being tied to the exposed conductive pads 90 on the fourth row 104d at the ninth column 102i, seventh column 102g, and the fifth column 102e. As shown, the input matching network 42 is in close physical proximity to the first amplifier 36 as well as to the exposed conductive pad 90 for the transmit input port 34. Along these lines, the output matching network 46 is in close physical proximity to the power amplifier 40 as well as to the switch 22.

The low noise amplifier 26, on the other hand, is placed apart from the power amplifiers at the second row 104b and the third column 102c so as to maximize transmit and receive isolation. This positioning also envisions the ready removal of the low noise amplifier 26 from the wafer design, so that product can be rapidly shifted to a power amplifier-only configuration without a redesign cycle.

The low drop-off voltage regulator 84 is placed toward the top of the die structure 100a, again for ready removal without involving a re-design of the entire remainder of the circuit. Alternative voltage regulators can be substituted in this space, and so changing from mobile communications front end circuits to WLAN front end circuits can be readily achieved.

This layout of the exposed conductive pads 90 are conducive for the sharing of pads that can be shared, for example, the Vdd pad 90a, the power detector output pad 90b, and a control line pad 90c, which are positioned along a first row 104a.

Figure 6:
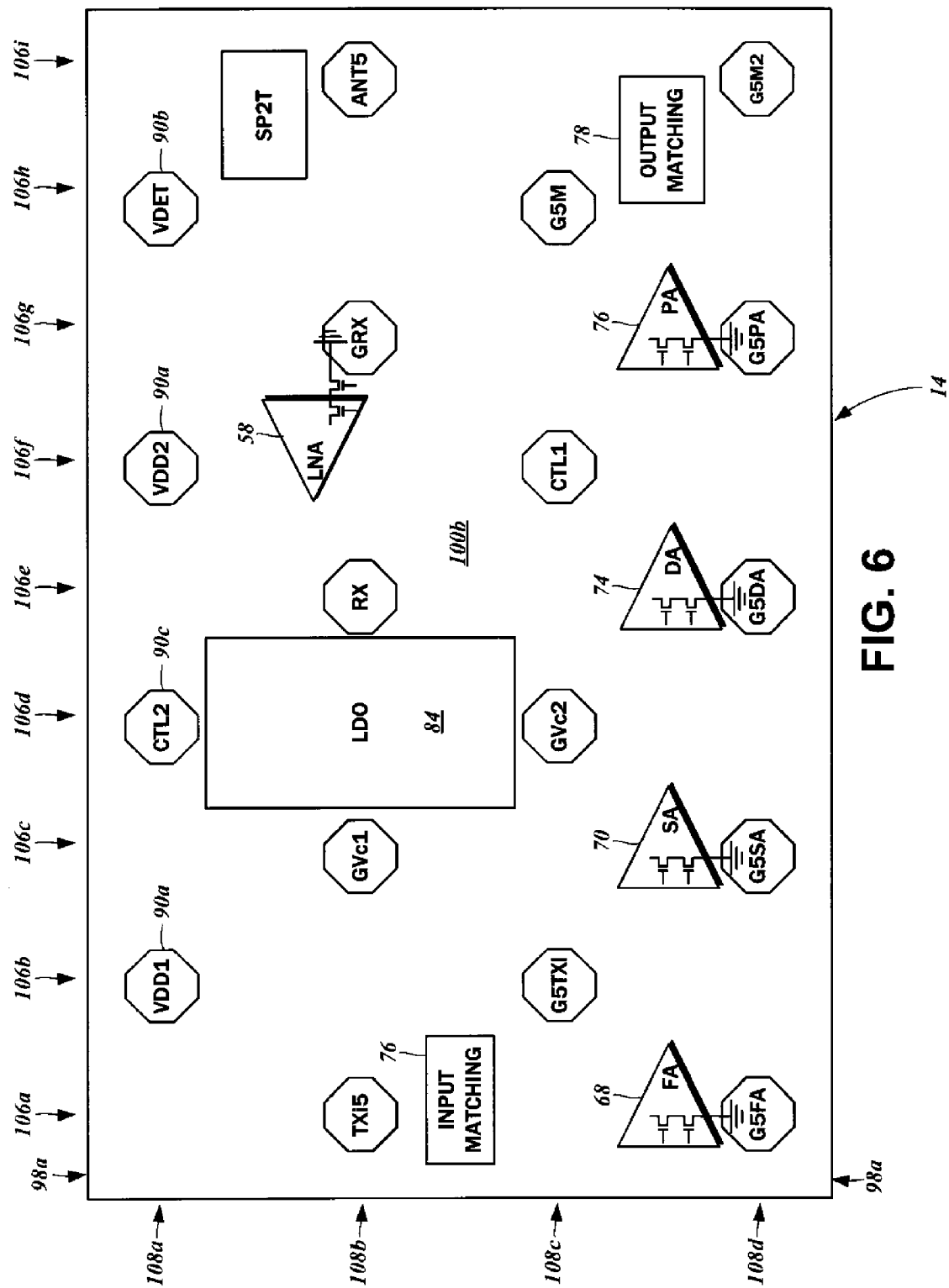
FIG. 6 is a plan view of the die structure pad layout for a second operating frequency circuit.

The plan view of FIG. 6 is that of a die structure 100b for an exemplary second operating frequency circuit 14. The exposed conductive pads 90 are arranged in a grid of columns 106a-i and rows 108a-d, with alternating rows being vertically offset from the next and alternating columns being horizontally offset from the next. Similar to the die structure 100a, in the die structure 100b, the power amplifiers of the corresponding transmit chain 56, that is, the first amplifier 68, the second amplifier 70, the driver amplifier 72, and the power amplifier 74 are positioned along the bottom side 98a of the die structure 100b. The ground connections thereof are tied to the exposed conductive pads 90 on the fourth row 108d at the first column 106a, the third column 106c, the fifth column 106e, and the seventh column 106g. Again, the input matching network 76 is in close physical proximity to the first amplifier 68 as well as to the exposed conductive pad 90 of the transmit input port 66. The output matching network 78 is in close physical proximity to the power amplifier 74. The low noise amplifier 58 is placed apart from the power amplifiers at the second row 108b and the seventh column 106g so as to maximize transmit and receive isolation. The low drop-off voltage regulator 84 is placed toward the top side 98b of the die structure 100b. Similar to the layout of the die structure 100a, this configuration is understood to enable sharing of pads that are conducive to sharing, including the Vdd pad 90a, the power detector output pad 90b, and the control line pad 90c.

Figure 7:
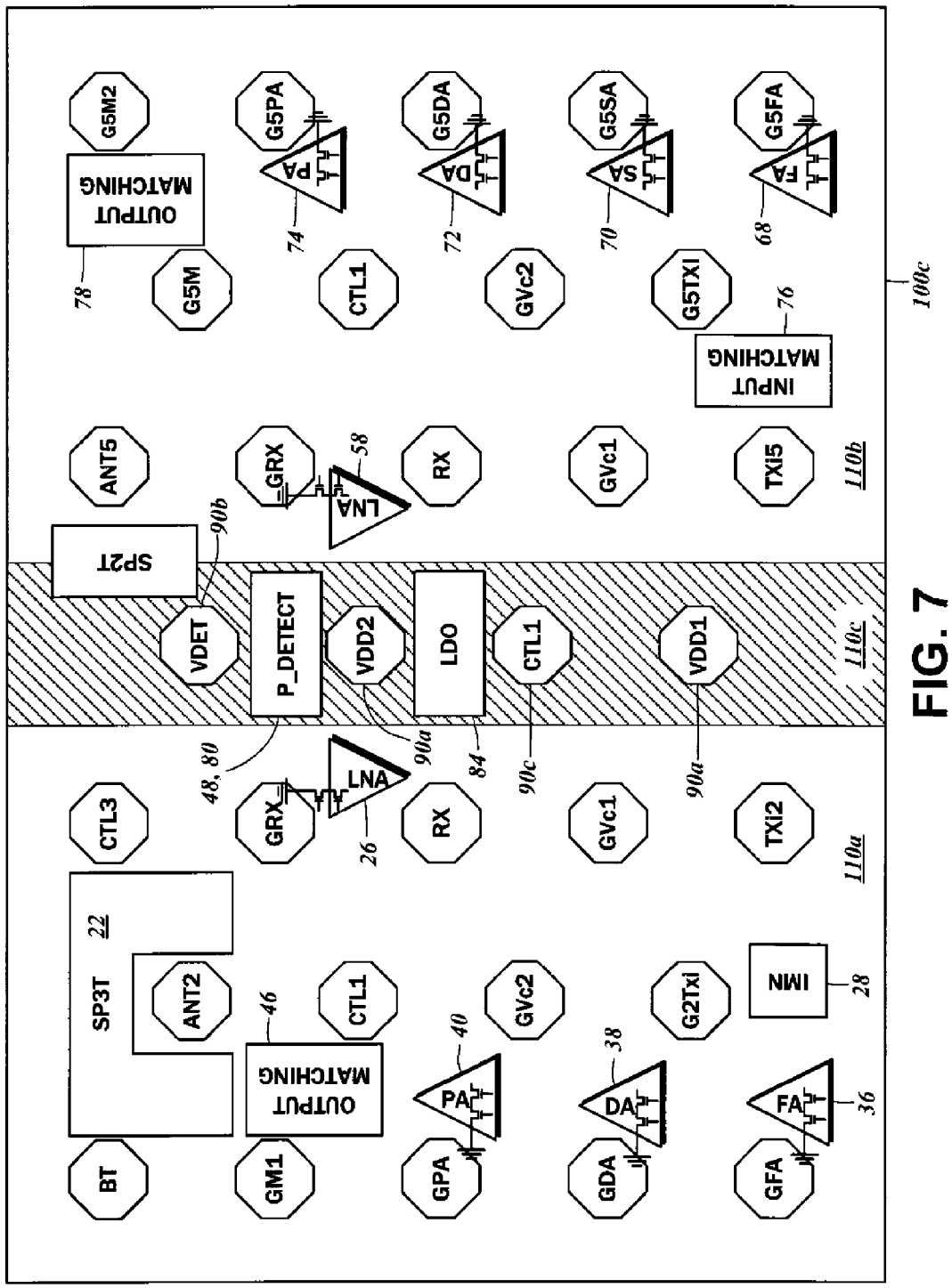
FIG. 7 is a plan view of the die structure pad layout in accordance with a first embodiment of the present disclosure with a first operating frequency region, a second operating frequency region, and a shared region.

With reference to the plan view of FIG. 7, one embodiment of the die structure 100c contemplates combining the aforementioned die structure 100a including the first operating frequency circuit 12 and the die structure 100c including the second operating frequency circuit 14 in a manner that retains all functionality of the constituent circuits, yet has a smaller area. At least one column 102, 106 can be eliminated by sharing of the exposed conductive pads 90. In one embodiment, these shared exposed conductive pads 90 are the Vdd pads 90a, the power detector output pad 90b, and the control line pad 90c.

The die structure 100c is defined by a first operating frequency region 110a that includes the first operating frequency circuit 12, including the low noise amplifier 26, the first amplifier 36, the driver amplifier 38, and the power amplifier 40, among other components. The low noise amplifier 26 is understood to be part of a first receive chain, while the first amplifier 36, the driver amplifier 38, and the power amplifier are understood to be part of a first transmit chain. Additionally, the die structure 100c is defined by a second operating frequency region 110b that includes the second operating frequency circuit 14, including the low noise amplifier 58 that is part of a second receive chain, as well as the first amplifier 68, the second amplifier 70, the driver amplifier 72, and the power amplifier 74, which are part of a second receive chain. Finally, there is a shared region 110c that is defined by an overlapping segment of the first operating frequency region 110a and the second operating frequency region 110b.

The shared region 110c includes the aforementioned shared Vdd pads 90a, the power detector output pad 90b, and the control line pad 90c. As indicated above, the Vdd pads 90a are a shared connection to the battery, and may be connected to a shared low drop-off voltage regulator 84, which is also understood to be disposed within the shared region 110c. The outputs of the low drop-off voltage regulator 84 are connected to the source power inputs of the various amplifiers of the first transmit chain, second transmit chain, the first receive chain, and the second receive chain.

In the embodiment shown in FIG. 7, the power detectors 48, 80 in its combined form depicted in its entirety in FIG. 3 is disposed within the shared region 110c. The output thereof, which are from each of the first transmit chain and the second chain, is connected to the single power detector output pad 90b. Thus combining the power detectors 48, 80 to detect both the 5 GHz band and the 2.4 GHz band is understood to at least partially make the sharing of the exposed conductive pads 90 for different functions a possibility.

The shared region 110c may also include the control line pad 90c that are connected to both the first transmit chain the first receive chain. Although the various exposed conductive pads 90a-c have been shown in a particular order, it will be appreciated by those having ordinary skill in the art that the exposed conductive pads 90 can be re-arranged without departing from the present disclosure.

In combining the die structure 100a shown in FIG. 5 and the die structure 100b shown in FIG. 6 to yield the die structure 100c shown in FIG. 7, either one of the die structure 100a or the die structure 100b is mirrored relative to the configurations depicted. The arrangement of the exposed conductive pads 90 that are to be shared are overlapped, with the arrangement of the remainder of the exposed conductive pads 90 being adjusted accordingly. As illustrated in the example, the combined die structure 100c has a total of seven columns of exposed conductive pads 90, rather than the eight that would have otherwise been required had the die structure 100a and the die structure 100b been simply juxtaposed side-by-side. The reduction in size can be quantified as being at least 10%, though in some cases it may be as much as 30%. This sharing of exposed conductive pads 90 is thus understood to minimize the size of the die structure 100 in the dual or multi-band front end circuit 10. Furthermore, the contemplated architecture allows for effortless derivation of individual single band circuits/devices, which reduces the time and cost of semiconductor device design cycles.

With the transmit chains of the respective first operating frequency circuit 12 and the second operating frequency circuit 14 being disposed on the outer periphery of the die structure 100c, and with the receive chains of being disposed toward a central region and adjacent to the shared region 110c, it is understood that transmit/receive coupling is minimized, that is, isolation between the transmit chains and the receive chains is increased.

Figure 8:
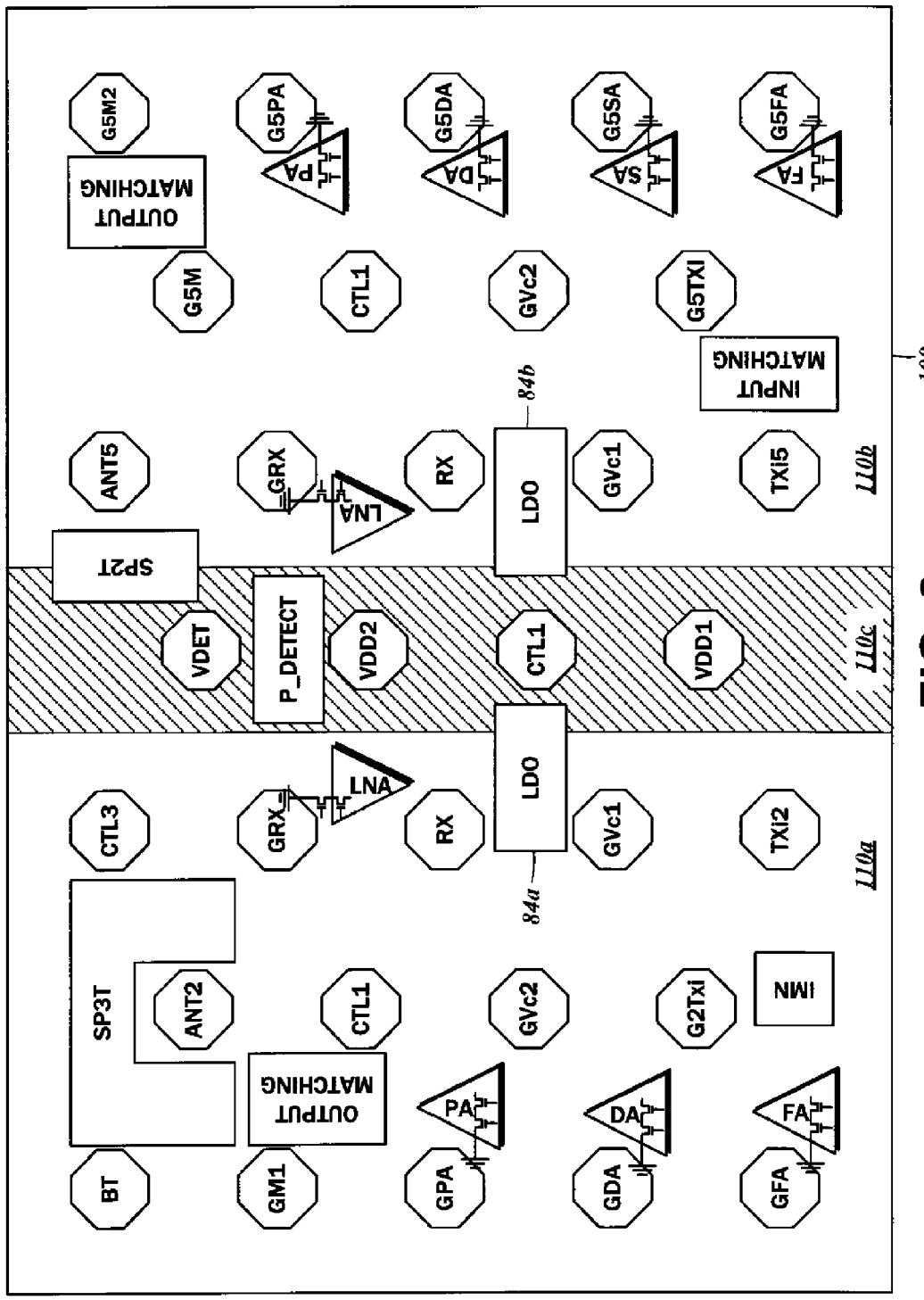
FIG. 8 is a plan view of the die structure pad layout in accordance with a second embodiment of the present disclosure.

The embodiment of the die structure 100d shown in FIG. 8 is substantially the same as the die structure 100c shown in FIG. 7, except with the low drop-off voltage regulator 84 being separated into the constituent parts 84a, 84b, with each being disposed in the respective first operating frequency region 110a and second operating frequency region 110b.

Other characteristics are envisioned and realized with respect to the exposed conductive pads 90, and in particular, with the specific positioning of the amplifiers of the transmit chains. For instance, source terminals of the amplifier transistors are understood to be positioned in close proximity to the exposed conductive pads 90, and hence to the solder balls and or the copper pillars that are attached to the same. This is understood to better distribute the heat generated by the transistor, and thereby maximize linear power.

Figure 9:
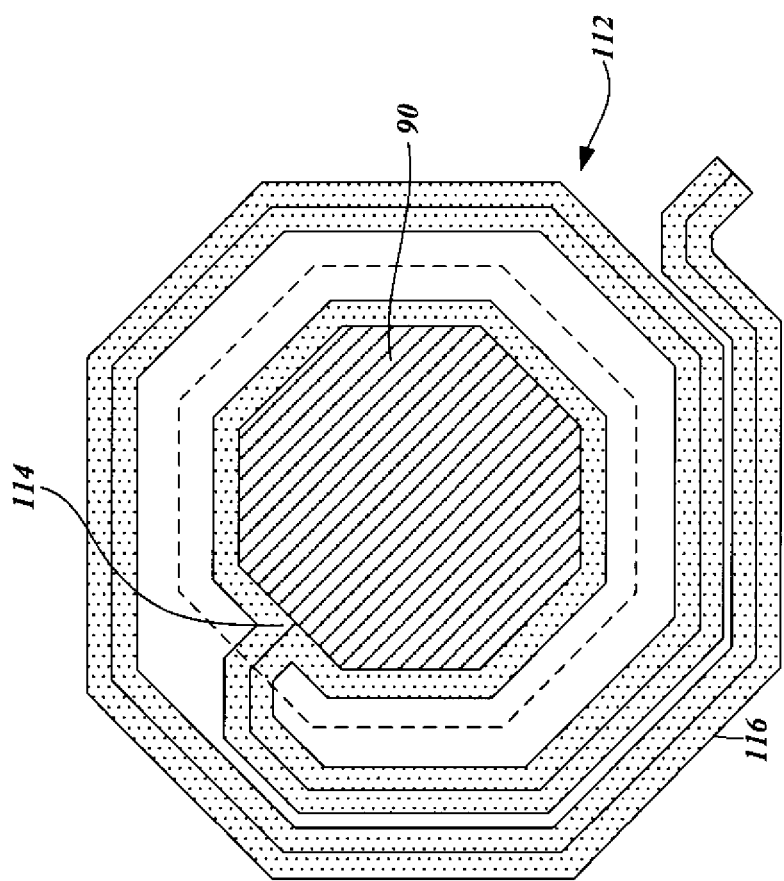
FIG. 9 is a plan view of a spirally wound inductor connected to an exposed conductive pad.

Typical on-die inductors utilized in RF integrated circuits, multimode integrated circuits, and power amplifier front end circuits occupy upwards of 60% to 90% of the area of the die structure 100, and bond wire implementations have significantly wider tolerance ranges such that critical specifications of linearity, error vector magnitude (EVM) in power amplifiers, and noise figures in low noise amplifiers are affected. Furthermore, the inductor quality (Q) factor and size are inversely related, so high Q factor inductors typically occupy much space. Further die size reductions are contemplated in accordance with various embodiments of the present disclosure shown in FIG. 9, which is of a planar inductor 112 that is defined by a terminal 114 that is electrically connected to the exposed conductive pad 90 and a conductive trace 116 that spirally winds around the exposed conductive pad 90. The conductive trace 116 winding may repeat until a predetermined inductance value and Q is yielded. The end of the winding may be characterized as a terminal that is connected to a particular node in the circuit.

This inductor 112 may be utilized in connection with any of the aforementioned exposed conductive pads 90, and is understood to have a high Q with a small footprint over existing on-die inductors. According to one example implementation, the total area of the inductor is understood to be 210 μm×210 μm, while the area of the exposed conductive pad 90 is understood to be approximately 120 μm×120 μm. Thus, the area of the inductor is understood to be approximately 150 μm×150 μm. Based on simulations, the inductor 112 has a Q value of approximately 20.2 at 6 GHz, and an inductance value of 753 pico Henries. This is comparable to an inductor of 210 μm×210 μm, so there is a significant reduction in size. The use of these improved inductors is envisioned to reduce the total cost of amplifiers implemented on the die structure 100.

The particulars shown herein are by way of example and for purposes of illustrative discussion of the embodiments of the present disclosure only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. An integrated circuit architecture defined by a die structure with a plurality of exposed conductive pads arranged in a grid of rows and columns, the integrated circuit architecture comprising:

a first operating frequency region of the die structure including a first transmit chain with at least one first operating frequency power amplifier and a first receive chain including at least one first operating frequency low noise amplifier;

a second operating frequency region of the die structure including a second transmit chain with at least one second operating frequency power amplifier and a second receive chain including at least one second operating frequency low noise amplifier; and a shared region of the die structure defined by an overlapping segment of the first operating frequency region and the second operating frequency region, the shared region including at least one of a shared power input conductive pad connected to the first transmit chain, the second transmit chain, the first receive chain, and the second receive chain, and a shared power detection output conductive pad connected to the first transmit chain and the second transmit chain;

a shared voltage regulator disposed in the shared region of the die structure and connected to the shared power input pad, the shared voltage regulator including a first operating frequency regulated power output connected to the first transmit chain and the first receive chain, and a second operating frequency regulated power output connected to the second transmit chain and the second receive chain.

2. The integrated circuit architecture of claim 1, wherein the shared voltage regulator is a low drop off voltage regulator.

3. The integrated circuit architecture of claim 1, wherein the shared region of the die structure includes a control input conductive pad connected to both the first transmit chain and the second transmit chain.

4. The integrated circuit architecture of claim 1, wherein the shared region of the die structure includes a control input conductive pad connected to both the first receive chain and the second receive chain.

5. The integrated circuit architecture of claim 1, further comprising:
   a first power detector circuit disposed on the shared region of the die structure and connected to the shared power detection output conductive pad, an input of the first power detector circuit being connected to an output of the first transmit chain; and
   a second power detector circuit disposed on the shared region of the die structure and connected to the shared power detection output conductive pad, an input of the second power detector circuit being connected to an output of the second transmit chain.

6. The integrated circuit architecture of claim 1, further comprising solder balls bonded to each of the exposed conductive pads.

7. The integrated circuit architecture of claim 1, further comprising copper pillars attached to each of the exposed conductive pads.

8. The integrated circuit architecture of claim 1, further comprising:
   a co-planar inductor defined by a terminal connected to a one of the plurality of exposed conductive pads, and a conductive trace wound around a periphery of the one of the plurality of exposed conductive pads in a spiral.

9. The integrated circuit architecture of claim 1, wherein the first transmit chain and the first receive chain are tuned for a 2.4 GHz operating frequency band and the second transmit chain and the second receive chain are tuned for a 5 GHz operating frequency band.

10. An integrated circuit architecture defined by a die structure with a plurality of exposed conductive pads arranged in a grid of rows and columns, the integrated circuit architecture comprising:
   a first operating frequency region of the die structure including a first transmit chain with at least one first operating frequency power amplifier and a first receive chain including at least one first operating frequency low noise amplifier;
   a second operating frequency region of the die structure including a second transmit chain with at least one second operating frequency power amplifier and a second receive chain including at least one second operating frequency low noise amplifier; and
   a shared region of the die structure defined by an overlapping segment of the first operating frequency region and the second operating frequency region, the shared region including at least one of a shared power input conductive pad connected to the first transmit chain, the second transmit chain, the first receive chain, and the second receive chain, and a shared power detection output conductive pad connected to the first transmit chain and the second transmit chain;
   a first operating frequency voltage regulator disposed in the first operating frequency region of the die structure and connected to the shared power input conductive pad, the first operating frequency voltage regulator including a first operating frequency power output connected to the first transmit chain and the first receive chain; and
   a second operating frequency voltage regulator disposed in the second operating frequency region of the die structure and connected to the shared power input conductive pad, the second operating frequency voltage regulator including a second operating frequency power output connected to the second transmit chain and the second receive chain.

11. The integrated circuit architecture of claim 10, wherein the first operating frequency voltage regulator and the second operating frequency voltage regulator are low drop off voltage regulators.

12. The integrated circuit architecture of claim 10, wherein:
   the first operating frequency voltage regulator is disposed on the die structure in close proximity to supply nodes of the at least one first operating frequency power amplifier; and
   the second operating frequency voltage regulator is disposed on the die structure in close proximity to supply nodes of the at least one second operating frequency power amplifier.

13. The integrated circuit architecture of claim 10, wherein the shared region of the die structure includes a control input conductive pad connected to both the first transmit chain and the second transmit chain.

14. The integrated circuit architecture of claim 10, wherein the shared region of the die structure includes a control input conductive pad connected to both the first receive chain and the second receive chain.

15. The integrated circuit architecture of claim 10, further comprising:
   a first power detector circuit disposed on the shared region of the die structure and connected to the shared power detection output conductive pad, an input of the first power detector circuit being connected to an output of the first transmit chain; and
   a second power detector circuit disposed on the shared region of the die structure and connected to the shared power detection output conductive pad, an input of the second power detector circuit being connected to an output of the second transmit chain.

16. The integrated circuit architecture of claim 10, further comprising solder balls bonded to each of the exposed conductive pads.

17. The integrated circuit architecture of claim 10, further comprising copper pillars attached to each of the exposed conductive pads.

18. The integrated circuit architecture of claim 10, further comprising:
   a co-planar inductor defined by a terminal connected to a one of the plurality of exposed conductive pads, and a conductive trace wound around a periphery of the one of the plurality of exposed conductive pads in a spiral.

19. The integrated circuit architecture of claim 10, wherein the first transmit chain and the first receive chain are tuned for a 2.4 GHz operating frequency band and the second transmit chain and the second receive chain are tuned for a 5 GHz operating frequency band.

20. An integrated circuit architecture defined by a die structure with a plurality of exposed conductive pads arranged in a grid of rows and columns, the integrated circuit architecture comprising:
   a first operating frequency region of the die structure including a first transmit chain with at least one first operating frequency power amplifier and a first receive chain including at least one first operating frequency low noise amplifier;
   a second operating frequency region of the die structure including a second transmit chain with at least one second operating frequency power amplifier and a second receive chain including at least one second operating frequency low noise amplifier; and a shared region of the die structure defined by an overlapping segment of the first operating frequency region and the second operating frequency region, the shared region including at least one of a shared power input conductive pad connected to the first transmit chain, the second transmit chain, the first receive chain, and the second receive chain, and a shared power detection output conductive pad connected to the first transmit chain and the second transmit chain;

wherein the first operating frequency region includes a first antenna conductive pad and the second operating frequency includes a second antenna conductive pad.

21. The integrated circuit architecture of claim 20, wherein:

the first operating frequency region of the die structure includes a first switch disposed thereon selectively connecting the first antenna conductive pad to the first transmit chain and the first receive chain; and the second operating frequency region of the die structure includes a second switch disposed thereon selectively connecting the second antenna conductive pad to the second transmit chain and the second receive chain.

22. An integrated circuit architecture defined by a die structure with a plurality of exposed conductive pads arranged in a grid of rows and columns, the integrated circuit architecture comprising:

a first operating frequency region of the die structure including a first transmit chain with at least one first operating frequency power amplifier and a first receive chain including at least one first operating frequency low noise amplifier;

a second operating frequency region of the die structure including a second transmit chain with at least one second operating frequency power amplifier and a second receive chain including at least one second operating frequency low noise amplifier;

a shared region of the die structure defined by an overlapping segment of the first operating frequency region and the second operating frequency region, the shared region including at least one of a shared power input conductive pad connected to the first transmit chain, the second transmit chain, the first receive chain, and the second receive chain, and a shared power detection output conductive pad connected to the first transmit chain and the second transmit chain;

wherein the first operating frequency region of the die structure is defined by a first outer periphery and an opposed first inner periphery adjacent to the shared region and the second operating frequency region of the die structure is defined by a second outer periphery and an opposed second inner periphery adjacent to the shared region.

23. The integrated circuit architecture of claim 22, wherein the at least one first operating frequency power amplifier is disposed on the first outer periphery and the at least one first operating frequency low noise amplifier is disposed in the first inner periphery away from the at least one first operating frequency power amplifier.

24. The integrated circuit architecture of claim 22, further comprising:

one or more ground conductive pads of the at least one first operating frequency power amplifier disposed along the first outer periphery of the first operating frequency region; and one or more ground conductive pads of the at least one second operating frequency power amplifier disposed along the second outer periphery of the second operating frequency region.

25. The integrated circuit architecture of claim 24, wherein source terminals of transistors of the at least one first operating frequency power amplifier are positioned in proximity to the one or more ground conductive pads.

26. The integrated circuit architecture of claim 22, further comprising:

one or more ground conductive pads of the at least one first operating frequency low noise amplifier are disposed along the first inner periphery of the first operating frequency region; and one or more ground conductive pads of the at least one second operating frequency low noise amplifier are disposed along the second inner periphery of the second operating frequency region.

* * * * *